United States Patent [19]
Teitzel et al.

[11] Patent Number: 5,533,170
[45] Date of Patent: Jul. 2, 1996

[54] RASTERIZER FOR A PATTERN GENERATION APPARATUS

[75] Inventors: Robin L. Teitzel, Portland; Matthew J. Jolley; James B. Campbell, both of Beaverton; Richard K. George, Portland; John Wipfli, Hillsboro, all of Oreg.

[73] Assignee: ETEC Systems, Inc., Beaverton, Oreg.

[21] Appl. No.: 344,417

[22] Filed: Nov. 22, 1994

Related U.S. Application Data

[63] Continuation of Ser. No. 970,293, Nov. 2, 1992.

[51] Int. Cl.$^6$ .................................................. G06K 15/00
[52] U.S. Cl. .......................................... 395/108; 395/163
[58] Field of Search ..................................... 395/104, 108,
395/163, 107, 101, 114, 150–152, 110;
382/52, 54, 53, 254, 258, 267, 274; 358/459,
462, 465, 426; 347/237

[56] References Cited

U.S. PATENT DOCUMENTS

| | | | |
|---|---|---|---|
| 4,668,995 | 5/1987 | Chen et al. ................ | 358/280 |
| 4,796,038 | 1/1989 | Allen et al. . | |
| 4,806,921 | 2/1989 | Goodman et al. . | |
| 4,907,282 | 3/1990 | Daly et al. ................ | 395/150 |
| 4,949,280 | 8/1990 | Littlefield ................ | 395/163 |
| 4,956,650 | 9/1990 | Allen et al. . | |
| 4,958,303 | 9/1990 | Assarpour et al. ........... | 395/163 |
| 5,103,101 | 4/1992 | Berglund et al. . | |

OTHER PUBLICATIONS

Michael L. Rieger, James A. Schoeffel, Paul A. Warkentin, 1988 SPIE Santa Clara Symposium Conference 922—Optical Microlithography VII, Image Quality Enhancements for Raster Scan Lithography, 10 pages.

*Primary Examiner*—Arthur G. Evans
*Attorney, Agent, or Firm*—Blakely, Sokoloff, Taylor & Zafman

[57] ABSTRACT

A rasterizer for generating pixel values for a pattern generation apparatus. The pixel values drive the printing mechanism of the pattern generation apparatus. The rasterizer receives a file defining the pattern to be printed, fractures the pattern into sub frames, rasterizes each sub frame and then coordinates the provision of the shaded pixel values to the pattern generation apparatus. The rasterizer of the present invention is comprised primarily of a host processing means for fracturing and translating the file into one or more sub frames of pixels; geometry engines for rasterizing each sub frame; beam boards for providing the pixel shading values to a pattern generation system; a serial bus for coupling the host processor means to the geometry engines and beam boards and a pixel bus for coupling each of the geometry engines to each of the beam boards.

13 Claims, 13 Drawing Sheets

| A |   | B |   | A |   | B |   | A |   | B |   | A |   |
|---|---|---|---|---|---|---|---|---|---|---|---|---|---|
|   | C |   | D |   | C |   | D |   | C |   | D |   | C |
| A |   | B |   | A |   | B |   | A |   | B |   | A |   |
|   | C |   | D |   | C |   | D |   | C |   | D |   | C |
| A |   | B |   | A |   | B |   | A |   | B |   | A |   |
|   | C |   | D |   | C |   | D |   | C |   | D |   | C |
| A |   | B |   | A |   | B |   | A |   | B |   | A |   |
|   | C |   | D |   | C |   | D |   | C |   | D |   | C |
| A |   | B |   | A |   | B |   | A |   | B |   | A |   |
|   | C |   | D |   | C |   | D |   | C |   | D |   | C |
| A |   | B |   | A |   | B |   | A |   | B |   | A |   |
|   | C |   | D |   | C |   | D |   | C |   | D |   | C |
| A |   | B |   | A |   | B |   | A |   | B |   | A |   |
|   | C |   | D |   | C |   | D |   | C |   | D |   | C |

Figure 3a

RASTERIZER FOR A PATTERN GENERATION APPARATUS

This is a continuation of application Ser. No. 07/970,293, filed Nov. 2, 1992.

BACKGROUND OF THE INVENTION

1. Field of the Invention

This invention relates to the field of converting digital data representing figures or objects into a pixel format for printing on a pattern generation system.

2. Prior Art

In the photolithographic fabrication of integrated circuits, resist sensitive to radiant particle energy is exposed in predetermined patterns to define circuit features. In some cases, the energy is passed through masks which contains the patterns, thereby selectively exposing a photoresist on a semiconductor body. In other instances, the resist is on a mask substrate and the direction of the radiant energy itself is controlled to define patterns in the resist. The selective exposure can be done as part of the making a mask (or reticle) or to directly "write" onto the resist film covering a semiconductor wafer. Several sources of radiant energy have been used, including ultraviolet light, visible light, coherent light, x-rays and electron beam (E-Beam).

A system for photolithographic fabrication of integrated circuits is described in U.S. Pat. No. 4,796,038 entitled "Laser Pattern Generation Apparatus" which is assigned to the assignee of the present invention. In U.S. Pat. No. 4,796,038 circuit patterns are written onto a workpiece by directing laser beams and moving a workpiece relative to the laser beams. A single laser beam is split into eight (8) beams to form a brush. The beams pass through Acousto-Optical Modulator (AOMs). The AOMs receive electric signals defining the circuit patterns. The AOMs are used to control the intensity of the beams as they write onto the workpiece. A steering mirror is used for directing the plurality of beams through a zoom lens arrangement and towards a rotating polygonal mirror. The steering mirror is used to adjust and align the beams in response to movement of the workpiece. The zoom lens arrangement is for adjusting the size and placement of the beams. The rotating polygonal mirror has a plurality of facets and is used to scan the beams onto the workpiece. Through successive scans, a stripe (one pass of the stage) is printed on the workpiece. The stripes comprise the different portions of the integrated circuit pattern. All stripes of a circuit are then printed on a workpiece. Thus, the circuit pattern is written onto the workpiece.

Commercially available systems embodying the laser pattern generation apparatus of U.S. Pat. No. 4,796,038 include the CORE 2100, 2500 and WAFER WRITE-6000 Systems available from Etec Systems, Inc. of Beaverton, Oreg.

As noted above, the electric signals which are received by the AOM's are generated by a rasterizer. By rasterized it is meant to convert the pattern into a collection of pixel values. The pixel values represent the electrical signals which are sent to the AOMs. Such a rasterizer is described in U.S. Pat. No 4,806,921, entitled "Rasterizer for Pattern Generator" which is assigned to the assignee of the present invention.

A method for improved control of modulation of radiant energy beams is found in U.S. Pat. No. 4,956,650 entitled "Pattern Generation System" which is assigned to the assignee of the present invention. This allows for correction of non-linearities in the turn on/turn off of the beams.

Rasterization is conceptually similar to creating a bit-mapped image of the circuit pattern. The bit-mapped image contains a plurality of pixel values. Each pixel value corresponds to an electrical signal sent to the AOMs. In order to obtain the fine detail needed for printing integrated circuits, the address grid is finer than the pixel grid.

The flow for providing the electrical signals to the AOMs is described with reference to FIG. 1. Referring to FIG. 1, a file 101 containing geometric instructions and placement instructions is provided to rasterizer 102. The file 101 may be in one of many commercially known writing formats, e.g. the MEBES® format or the ALF format. The rasterizer 102 creates a bit-mapped image 103 of the circuit pattern. Thus, the bit-mapped image of the pattern is printed many times on the wafer. The bit-mapped image 103 is then provided to the AOMs 104. The AOMs 104 control the exposure of the laser beams onto the workpiece, which effectively controls the printing operation.

Known rasterizers, are limited in their rendering speed, 2 bit intensities and their flexibility. Thus, it is an object of the present invention to provide a rasterizer which can supply multiple pixel intensities at an increased speed and which will allow scalability.

SUMMARY OF THE INVENTION

A rasterizer for generating pixel values for a pattern generation apparatus is disclosed. The pixel values drive the printing mechanism of the pattern generation apparatus. The rasterizer receives a file defining the pattern to be printed, fractures the pattern into sub frames, rasterizes each sub frame and then coordinates the provision of the pixels, to the pattern generation apparatus. The rasterizer of the present invention is comprised primarily of a host processing means for fracturing and translating said file into one or more sub frames; geometry engines for pasteurizing each sub frame; beam boards for storing and delivering pixels to a pattern generation system; a serial bus for coupling the host processor means to the geometry engines and beam boards and a pixel bus for coupling each of the geometry engines to the beam boards.

The host processor sends different sub frames to different geometry engines over the serial bus. The geometry engines rasterizes subframes into pixels in parallel. The geometry engines transmits the pixels to the beam boards in packets over the pixel bus. Each beam board interfaces to a single writing element of the pattern generation apparatus, e.g. a beam. The host processor also controls the transmission of pixel packets from the geometry engines to the beam boards and pixel values from the beam boards to the pattern generation apparatus.

BRIEF DESCRIPTION OF THE FIGURES

FIG. 3a illustrates a writing grid as utilized by the currently preferred embodiment of the present invention.

DETAILED DESCRIPTION OF THE PREFERRED EMBODIMENT

A method and apparatus for generating pixel values for use in a pattern generating apparatus is described. Such a laser pattern generation apparatus is particularly suitable for use in the photolithographic fabrication of integrated circuits. In the following description, numerous and specific details are set of such as pixel sizes, print strategies, etc. in order to provide a though understanding of the present invention. However, it would be apparent to one skilled in the art that the present invention maybe practiced with out such specific details. In other instances, certain protocol and timing aspects are not set forth in detail in order to not unnecessarily obscure the present invention.

Aspects of the present invention are disclosed in disclosure document number 311534 and 309875 filed pursuant to the document disclosure program of the United States Patent and Trademark Office.

A pattern generation apparatus as may be used with the present invention is described in co-pending application entitled "Improved Laser Pattern Generation Apparatus", Ser. No. 07/970,480 which assigned to the assignee of the present application.

Prior to describing the print generation apparatus, it is instructive to describe the beam organization, the error averaging techniques employed and the overall print strategy.

Beam Organization

Figure 1:
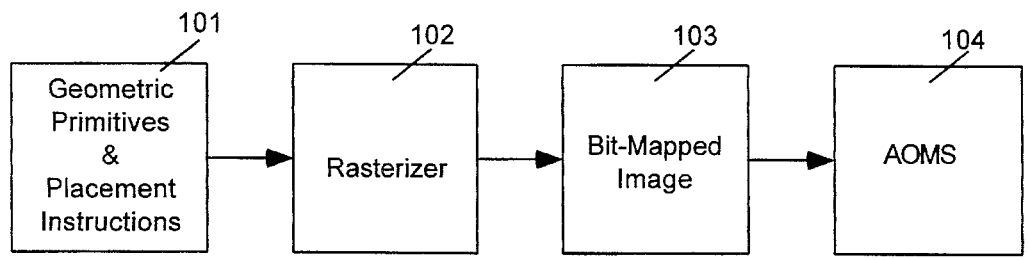
FIG. 1 illustrates the overall flow for the generation of pixel intensities for a pattern generation apparatus.
Figure 2A:
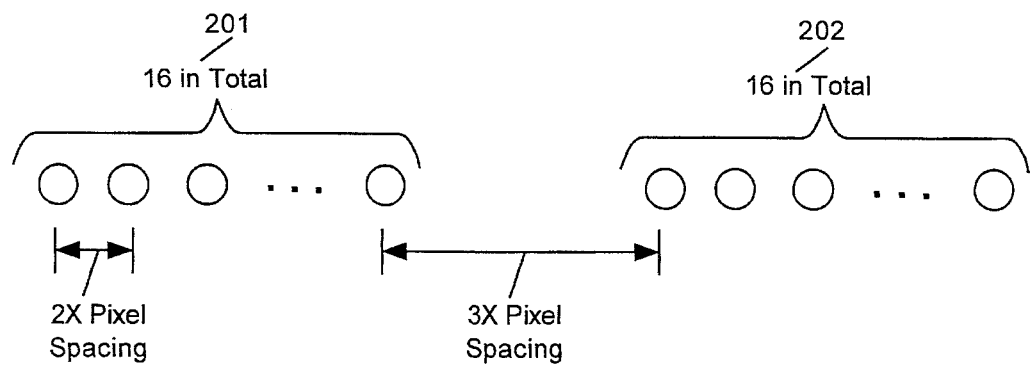
FIG. 2a illustrates the beam organization at a final image plane as utilized by the currently preferred embodiment of the present invention after the introduction of time delay.

As noted above the initial laser beam is split into 32 beams which are modulated to create the image on the workpiece. FIG. 2a illustrates the effective beam organization at the final image plane after timing delays are introduced. Referring to FIG. 2a, the beams are organized into two groups of 16 beams, 201 and 202 respectively. Each of the beams within a group is separated by a fixed predetermined distance in the stripe axis, namely a 2X pixel spacing (0.533 micrometers). In the currently preferred embodiment beam diameter is approximately 0.4 microns. To properly modulate the beams, the beams must be separated by more than one or two microns and yet print as if they are separated by 0.533 micrometers. In the currently preferred embodiment a pixel unit is 0.2666 micrometers or (25*32/3 nanometers in width). Between the two groups a 3X pixel spacing in the stripe axis is included (0.8 micrometers). This spacing in the stripe axis between the two sections is referred to as a diastemal split. The diastemal split plays a role in generating the proper error averaging during the successive passes in the printing processes.

As the workpiece moves in a direction perpendicular to the brush, to achieve the desired pattern, the data provide to each of the beams in the brush is delayed by n clocks, (or pixel period). In the currently preferred embodiment n is equal to six (6). This delays the data until the beam is in the correct position. The delay corresponds to the distance between the beams in the scan direction. The effective brush is a straight line.

Figure 2B:
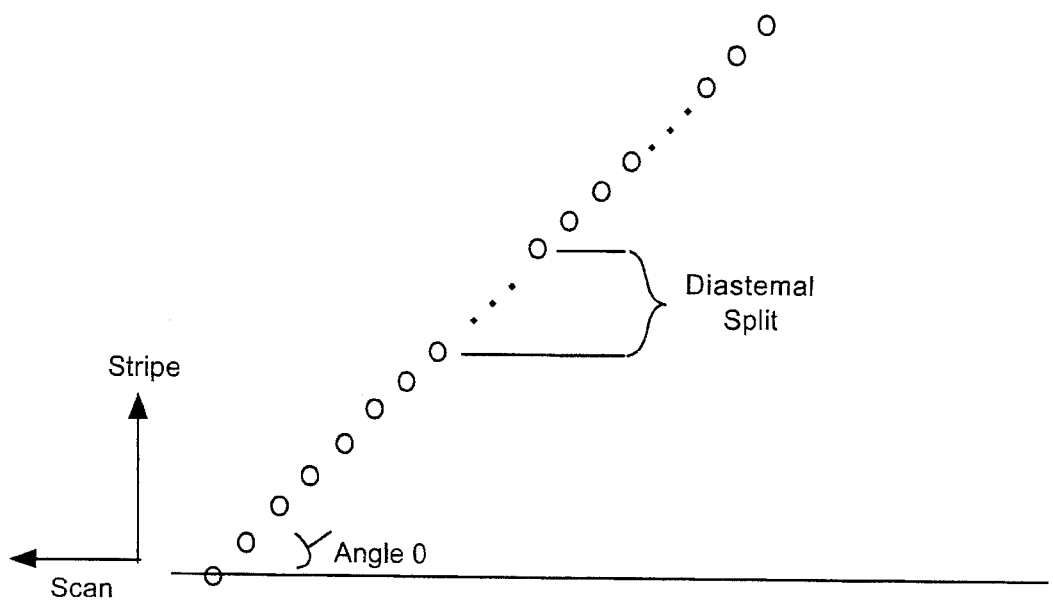
FIG. 2b illustrates the beam organization before a time delay being introduced.

FIG. 2b illustrates beam organization before introduction of a time delay. Referring to FIG. 2b, without a time delay, the beams comprising the brush are printed at the angle φ (theta) 210. Note that the spacings between the pixels 211 and the diastemal split are with respect to the stripe axis.

Figure 2C:
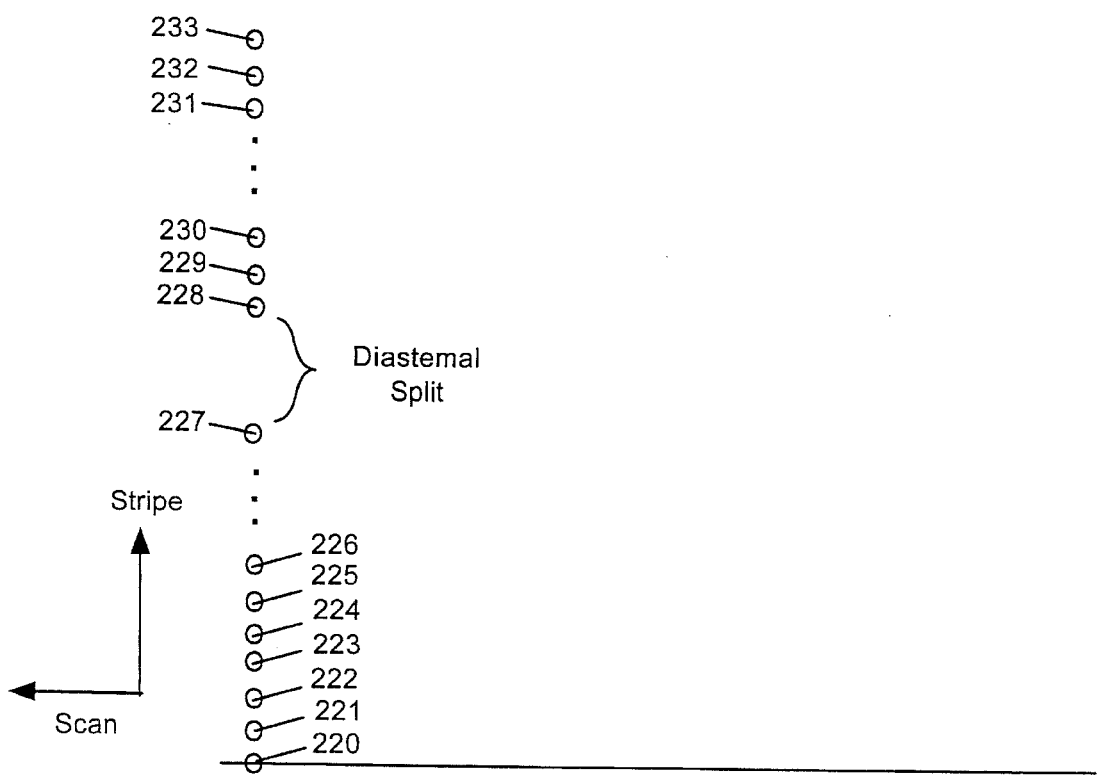
FIG. 2c illustrates the beam organization after a time delay being introduced.

Referring now to FIG. 2c, the printing of the beams after the delay is illustrated. Assuming beam 220 is printed first and the stage is moving from left to right, the remainder of the beams 221–233 are timed so the resulting printed image is a straight line.

Angle of Printing

Figure 2D:
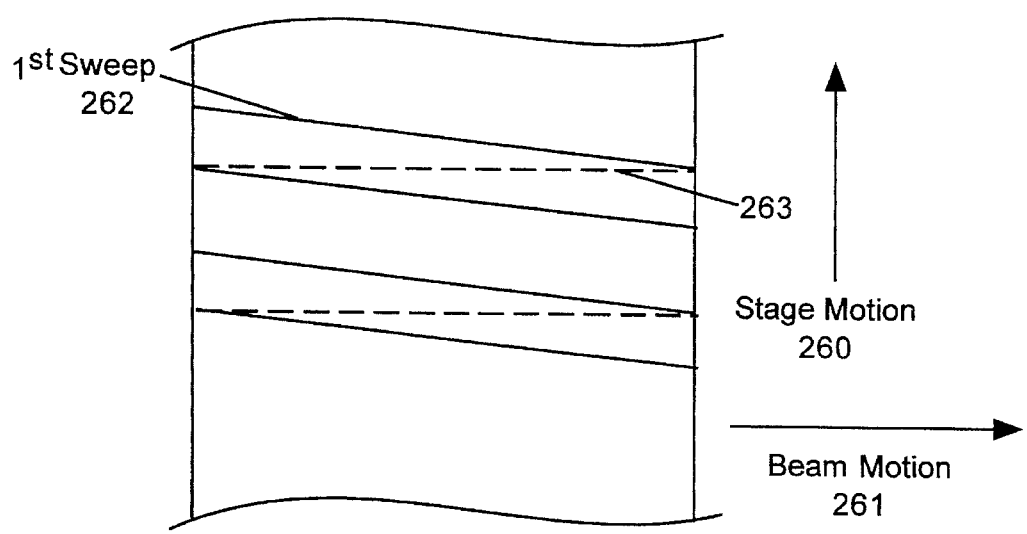
FIG. 2d illustrates the angle of printing resulting from the stage and beam motion of the currently preferred embodiment of the present invention.

As the printing process occurs, the stage motion and the beam motion create an angled line with respect to the stage motion. This is illustrated in FIG. 2d. From FIG. 2d it is shown that the stage motion 260 is perpendicular to beam motion 261. A first sweep 262 creates an angled line with respect to a beam motion axis 263. The angle is the arctan(32/4096) or the arctan (91/128) which is 7.812 m Radians. Note that the angle of printing limits the printing to one direction. Otherwise a "herringbone" pattern would result.

Figure 2E:
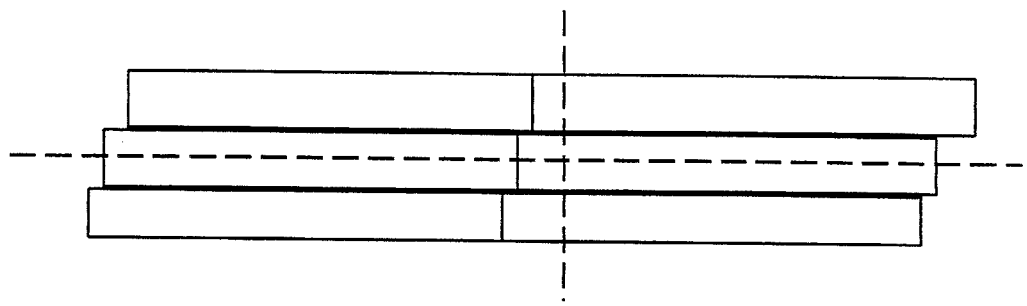
FIG. 2e illustrates a misaligned printing image resulting from rotation of the pattern to be generated.

The whole pattern is printed with this angle. The starting positions of the adjacent passes are offset so that the first sweeps all align without a zig-zag. Next, the whole printed image is rotated by this angle. In this way, the whole pattern is rotated. The object is to print on an angle. To accomplish this the axis of stage motion is set at a slight angle to the axis of polygon spin. The delays introduced to set theta to 18.434 degrees result in a brush that is exactly aligned to the polygon axis. Thus the scan footprint appears as a parallelogram as indicated in FIG. 2e. This is the method used in the laser pattern generation as described in U.S. Pat. No. 4,796,038.

Figure 2F:
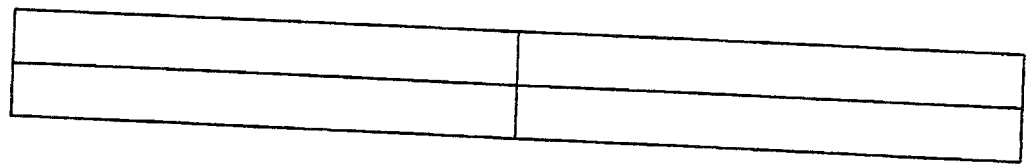
FIG. 2f illustrates the corrected printing image after the introduction of a pixel time delay as may be utilized in the currently preferred embodiment of the present invention.

The error in alignment of the ends of the parallelograms is ½ of a pixel for wider brush of a thirty-two (32) beam system. This is large compared to an acceptable error budget. To compensate, every pixel is delayed by a slight amount to create an angled brush, so that the printed area is a rectangle instead of a parallelogram. With a print clock period of 20 ns, the maximum delay is approximately 20 nS*½ or 10 nS. The increment of delay between beams is 0.312 nanoseconds. Note that this is a second delay added in addition to the beam delay discussed above with respect to beam organization. The final result would be as illustrated in FIG. 2f.

Print Strategy and Error Averaging

It has been determined that by making the pixel address grid small enough, any grid snap errors that would occur would be negligible (this also has the effect of eliminating the need for a Zoom Lens Assembly). The desired address grid is a multiple of 25 nM. The address grid chosen is 25 nM/3 or 8.3333 nM. Each pixel unit represents 32 address grid units. To accomplish this, beam intensity variation (gray scaling) for edge placement is utilized. In prior systems, gray scales were primarily achieved through successive physical stage passes over the workpiece. At most one intermediate gray scale value was introduced directly by beam intensity.

In the currently preferred embodiment of the present invention, gray scales are achieved through 17 levels of intensity variation of the beams in the brush and optionally through successive physical stage passes. The intensity values are generated by a rasterizer that is coupled to the pattern generation apparatus.

To increase the resolution and to improve the averaging, one pass is done according to a normal grid and one pass is done according to an interstitial grid. During each pass the two groups of 16 beams interleave each other. The interstitial grid is offset from the normal grid by half a pixel in both the stripe and scan axes. Effectively, four passes are done as two physical stage passes. For each group of beams and each pass the data is written on a different polygon facet. However, instead of printing the same data four times, the data during the four passes print different pixels. Since the beam diameter is larger than the pixel spacing, the averaging is still accomplished amongst neighboring pixels. This averaging technique forces every other pixel to be printed on a different facet of a rotating mirror.

A pixel grid as utilized in the currently preferred embodiment is illustrated in FIG. 3a. Referring to FIG. 3a, pixels labeled A and B are printed on one stage pass and pixels labeled C and D are printed on one stage pass. The pixels labeled A and B are printed on a normal grid, whereas the pixels labeled C and D are printed on the interstitial grid.

Generally, the printing system will print frames along the scan axis across the reticle as the workpiece moves along the stripe axis. A frame is a printing unit that is described in more detail below. By analogy, visualize a brush stroke going up and down across a horizontally moving surface to create a stripe. When a stripe is completed, the next stripe to be printed strategy is at the location on the reticle is just below the completed stripe. This strategy is acceptable for printing reticles, with data which is different stripe to stripe.

Figure 3B:
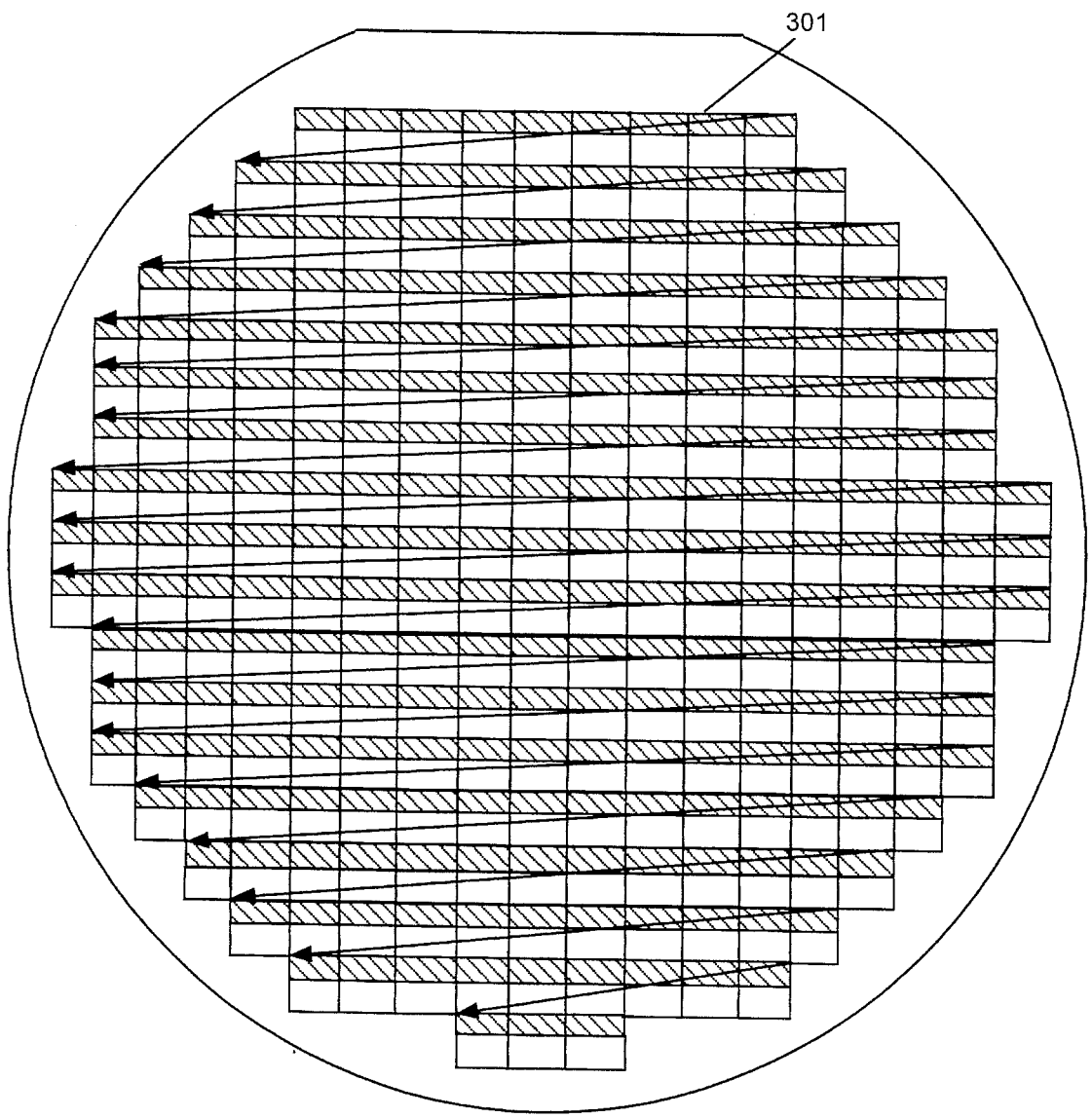
FIG. 3b illustrates the printing strategy on a mask as utilized by the currently preferred embodiment of the present invention.

For printing masks or wafers which contain multiple die with the same data, a different strategy is employed. FIG. 3b illustrates the general print strategy for printing an array of integrated circuits on a reticle or wafer. Referring to FIG. 3b, stripes are printed across the surface of the substrate along a stripe axis. It should be noted that reticles and wafers are comprised of a plurality of die. Each die on the reticle or wafer will have the same circuit pattern. Thus, in order to avoid the recalculation and reloading of data for each row of die, each identical stripe for each row of die is printed at one time. This is illustrated in FIG. 3b where a stripe 301 for each of the various row of die on the substrate is printed. As mentioned above, each stripe is printed by the printing of frames along a scan axis. This will become more apparent with respect to FIG. 4.

Figure 3C:
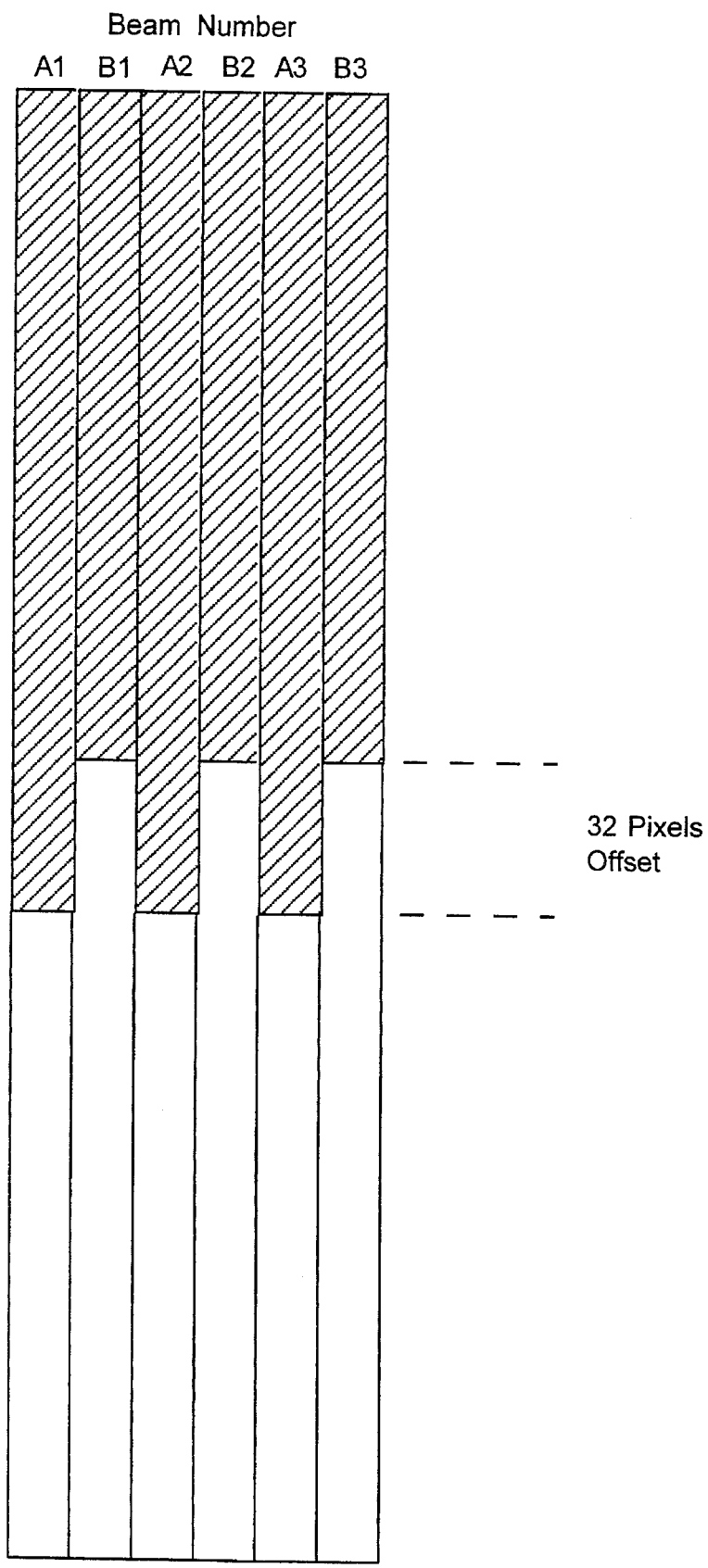
FIG. 3c illustrates the dovetail feature of the printing strategy as performed by the currently preferred embodiment of the present invention.

FIG. 3c illustrates another aspect of the print strategy called dovetailing. When two passes are printed next to each other there are small errors in the relative placement of the ends of the scan lines known as butting errors. Dovetailing is a technique whereby the scan lines formed by the individual beams are alternately offset in the scan direction. This effectively averages the errors in the butt joint over the distance of the offset.

Referring to FIG. 3c, a portion of the beam brush is illustrated. During a first pass, beams A1, A2 and A3 are offset from the beams B1, B2 and B3. During a pass m that a butts pass n, the beams retain the same offset. In the currently preferred embodiment the offset is 32 pixels. Thus it can be seen that the resulting printing from the beams is interleaved.

Butt joint errors are further reduced by printing the interstitial grid at a scan offset with respect to the normal grid. In this way a region with butt joints is averaged with a region without butt joints.

Figure 4:
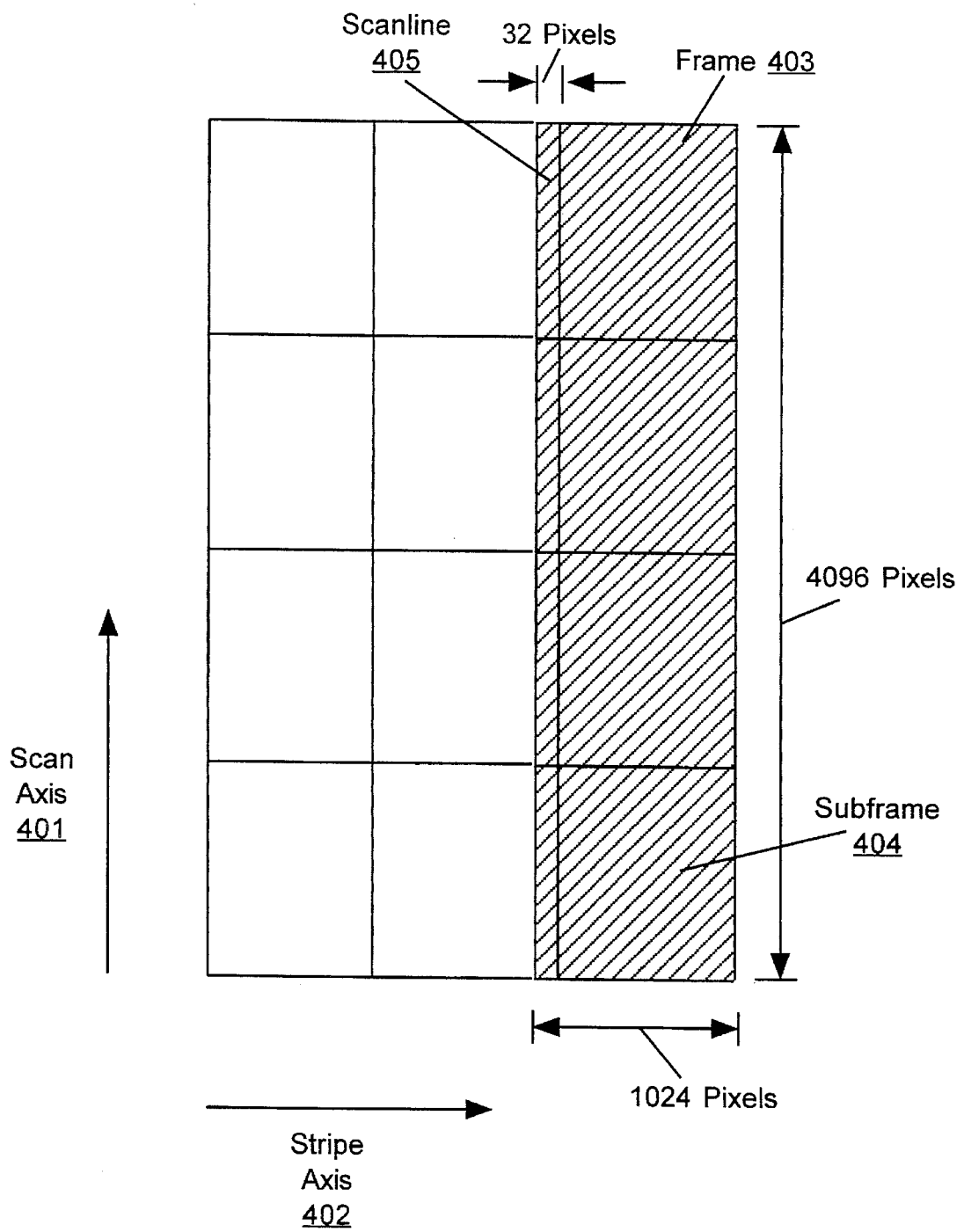
FIG. 4 illustrates the geometric coordinates and frame as utilized by the currently preferred embodiment of the present invention.

FIG. 4 illustrates the geometric coordinates and printing units as utilized in the currently preferred embodiment for the present invention. Referring to FIG. 4 a scan axis 401 and a stripe axis 402 are illustrated. As noted with reference to FIG. 3b, a stripe is printed across the substrate. For the purposes of generating accurate pixel data, a stripe is broken down into various subparts. A first unit is called a frame e.g. frame 403. The frame 403 is an area that is 1,024 pixels wide by 4,096 pixels tall. A pixel corresponds to what is printed by any of the plurality of beams. A pixel in the currently preferred embodiment is 0.26666 micrometers in width and will have 17 levels of gray. A frame is comprised of four sub frames, e.g. sub frame 404. A sub frame is 1,024 pixels wide by 1,024 pixels tall. Frames and sub frames are comprised of a plurality of scanlines e.g. scanline 405. A scan line is one sweep of a brush. A sweep of the brush occurs for the height of the frame. Since the brush is 32 pixels wide, a scan line is 32 by 4,096 pixels.

OVERVIEW OF THE RASTERIZER OF THE CURRENTLY PREFERRED EMBODIMENT

Figure 5:
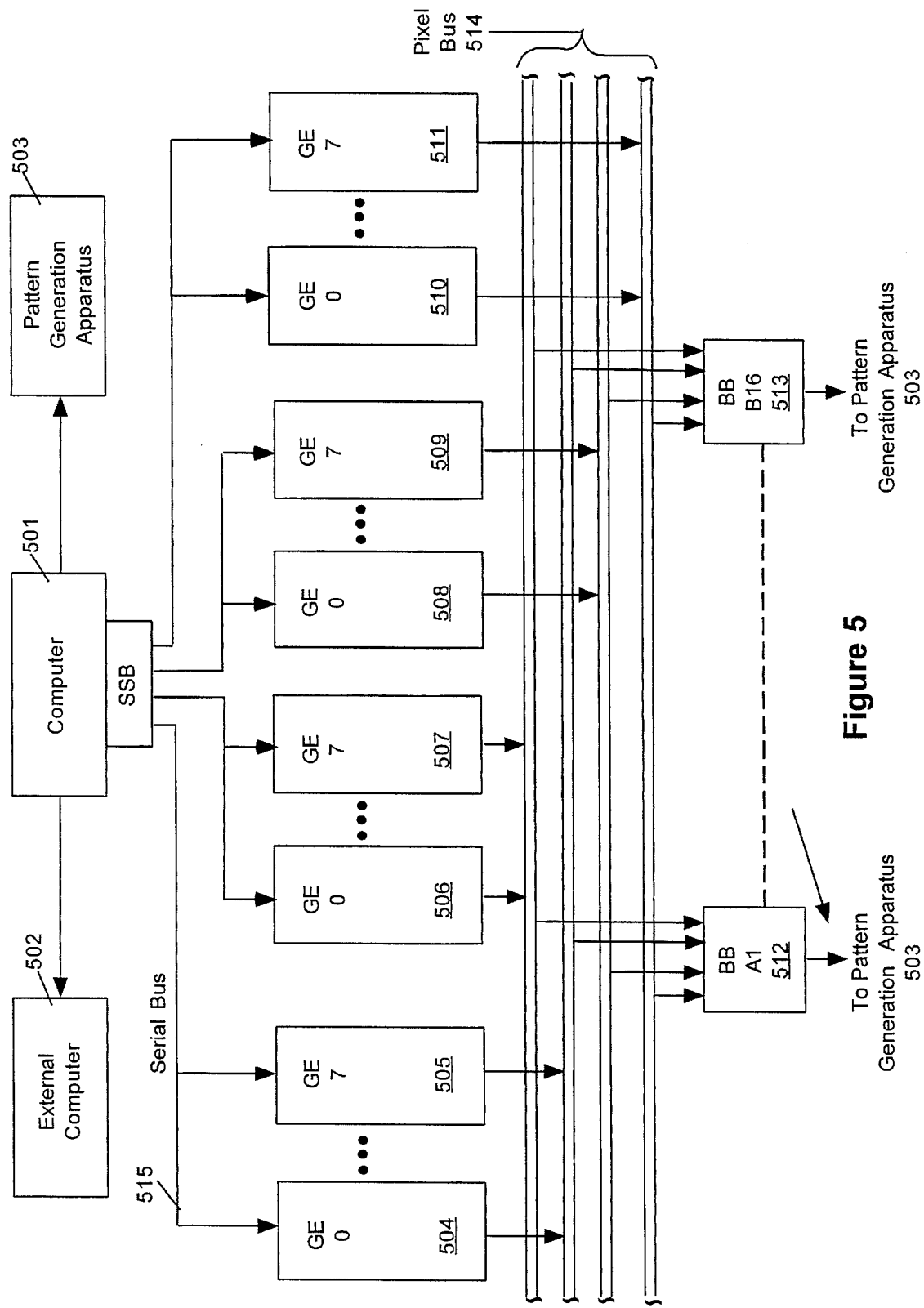
FIG. 5 is a block diagram illustrations of the rasterizer of the currently prefer embodiment of the present invention.

FIG. 5 is a block diagram of the rasterizer of the currently preferred embodiment. A host computer 501 interfaces with external computer system 502 for receiving data defining a circuit pattern and to the pattern generation apparatus 503 for receiving print control information. The data received from the external computer system 502 is typically a file containing instructions on placement and files of geometry descriptions. Such a file may be in one of the well known formats such as MEBES® or ALF®. Many well known commercially available application programs may be used for generating such files, e.g. DRACULA, available from CADENCE of San Jose, Calif., or CATS available from Transcription Enterprises Limited, of Los Gatos, Calif. Computing means on the host computer 501 would then fracture and translate the geometry description for rasterization by geometry engines 504–511.

The host computer 501 of the currently preferred embodiment is a SPARCSTATION 10 workstation, available from SUN Microsystems of Mountain View, Calif. However, other commercially available or proprietary computer systems having the same operating characteristics could be utilized without departing from the spirit and scope of the present invention.

The geometry engines 504–511 are coupled to host computer 501 through a serial bus 515. It is through the serial bus 515 that the geometry engines 504–511 receive geometry descriptions. In FIG. 5 geometry engines 504–511 are illustrated. However in the currently preferred embodiment there are 24 geometry engines. The geometry engines 504–511 translate the geometry description into a gray scale pixel map of a sub-frame. Each pixel value represents the desired beam intensity at the corresponding location. When a geometry engine has completed a sub-frame, pixel packets are transmitted to a plurality of beam boards. In FIG. 5 only two beam boards, i.e. beam boards 512–513 are illustrated but in the currently preferred embodiment there are 32 beam boards.

Each of the beam boards provides pixel data to one of the laser beams in the pattern generation apparatus. Each beam board is coupled to each of the geometry engines through a pixel bus 514. Although not illustrated, each beam board is further coupled to the serial bus 515 for communication with host computer 501. The beam boards collect and store the pixel data from the geometry engines. The beam boards coordinate the provision of pixel data to the pattern generation apparatus.

A feature of the rasterizer architecture is its scalability. For example, if the rasterizer is to be used with a pattern generation apparatus with more or less then 32 beams is required, greater or fewer beam boards may be utilized. Further, the number of geometry engines utilized can be increased or decreased depending on the desired pixel rendering performance.

Each of the components of the rasterizer is now described in greater detail.

The Host Computer

The geometry data for printing is compiled on the host computer in preparation for translation by the geometry engines. Generally, the host computer transforms and fractures the geometry data and placement instructions received from the external computer system into sub-frames for each geometry engine. The geometry data generated by the host computer may be in either compressed or uncompressed data forms. The compressed form of the data better utilizes the data path bandwidth as the data moves from the host to each geometry engine.

The two basic geometry types handled are rectangles and trapezoids. The trapezoids are further broken into two categories, 45 degree slopes and non 45 degree slopes. The data is sorted into geometry lists. By sorting lists a small amount of data compression is achieved. Rectangles are all grouped together as are trapezoids with identical slopes. Additional compression is achieved where a group of geometries repeated with only a change in the sub-frame origin. The sub-frame origin is manipulated in a variety of ways. For random placements the origin can simply be offset one time or by a list of row and column values. In a filled array pattern the row, column or both axes can be iterated upon with an offset added on each iteration. The third method is called a bit map. The origin information for the bit map is specified by a list of row and column values. A bit map then specifies which row and column crossing points are used as the origin offsets.

For each grouping of geometry's, header information is appended to the data describing what that grouping is. Each grouping is then called a geometry data object. In the currently preferred embodiment, geometry data objects include:

A list of rectangles
A list of discrete slope trapezoids
A list of trapezoids with identical slopes
A list of 45 degree trapezoids with identical slopes
A list of x-axis placements
A list of y-axis placements
A list of x and y-axis placements
A bit mapped instruction with lists of row and column placements.
An x-axis iteration specifying pitch
A y-axis iteration specifying pitch By utilizing the above geometry object forms, a complete sub-frame can be described in a minimum amount of space. Objects are concatenated to form compound objects. As will be described below, geometry primitives are interpreted by the geometry engine as if it were an instruction. Thus, any compound object can be called like a subroutine provided it is terminated with a return instruction. A hierarchical structure can then be built by called subroutines. Data objects can then be reused in different sub-frames with the same geometries.

The hierarchical geometry data is described by nested subroutines. Each subroutine is considered to be a geometry object. A geometry object is placed into the print image by offsetting the origin and invoking the object. Origin offsets are relative to the previously established offset and are nested as deeply as required. Each geometry object at the lowest level of hierarchy is defined by a set of primitive geometry objects to form a desired pattern. The next level of hierarchy defines objects which set the desired origin offsets for the placement of patterns previously described. An object can be placed multiple times by calling the object repeatedly or by using the object in an iterate, grid or bit mapped placement instruction. The levels of hierarchy continue as needed to describe the desired printing pattern.

The data objects are then inserted into one or more data packets for routing to the appropriate geometry engine. Each data packet is comprised of a header and data objects. The header contains the control information needed to route and identify the packet. The header also identifies the size of the data packet. The remainder of the packet is comprised of data objects.

The host computer controls the sending of pixel data by the geometry engines and the beam boards through pass lists. For the geometry engine, the pass list describes the sub-frames to be rasterized, the offset for the sub frame, and the order in which sub-frames are sent to the beam boards. For the beam boards, the pass list describes the order in which scan lines are transferred to the pattern generation apparatus.

Geometry Engine

The geometry engines perform th rasterization of geometry primitive. In the currently preferred embodiment each geometry engine rasterizes a different sub-frame. Up to 64 geometry engines may be utilized, all working on different sub-frames. Each of the geometry engines are identically configured. The general movement of data through the geometry begins with the geometries from the host computer and completes with the transfer of the rasterized information to the Beam Boards.

Figure 6:
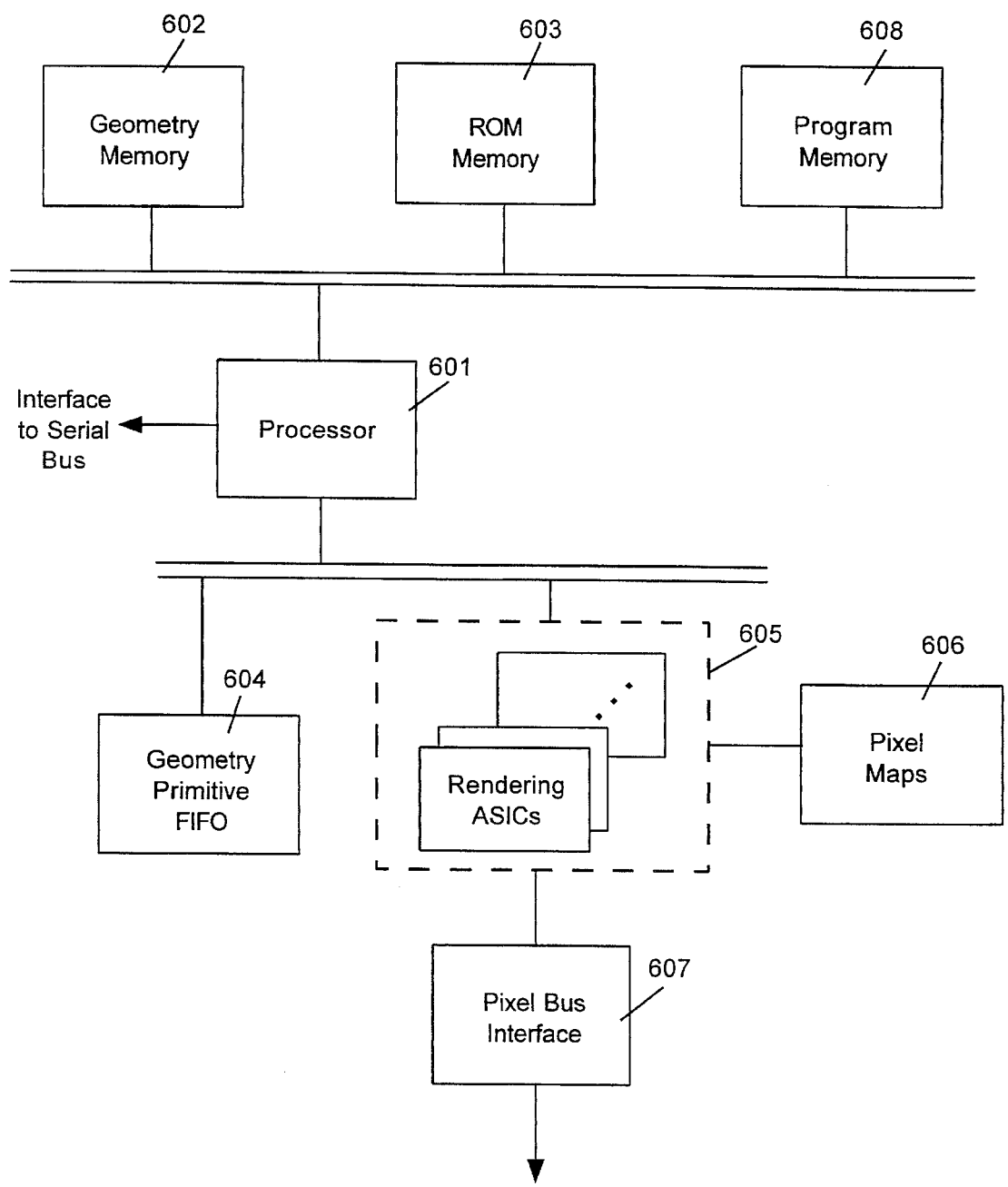
FIG. 6 is a block diagram illustration of a geometry engine as may be utilized in the currently preferred embodiment of the present invention.

FIG. 6 illustrates the geometry engine in block diagram form. A control processor 601, interfaces with a serial bus and the other components of the geometry engine. The control processor used is the TMS 320C30 available from Texas Instruments. However, it would be apparent to one skilled in the art to use other commercially available processor products.

The geometry data and commands from the host computer are transferred to the geometry engines in serial packets via the serial bus. The control processor 601 is coupled to the serial bus through an internal serial port. The control processor 601 utilizes an on-chip Direct Memory Access (DMA) channel (not illustrated) to move each word of the packet into RAM as a temporary storage area (not illustrated). The packet is checked and acknowledged in accordance with the serial bus protocol. After the packet is processed the data is placed into a geometry pass memory 602

In the currently preferred embodiment, the geometry primitives are processed in the control processor 601 by a command interpreter. Each geometry primitive is an interpreter command. The additional instructions of the interpreter include push/pop of the offset stack, branch, halt, call and return.

Each sub-frame geometry list is then executed. The compressed geometry data is expanded by the control processor 601 as it is moved to the geometry primitive FIFO 604. During the expansion step the x-axis coordinate is offset in each geometry. Rendering processors 605 receives geometry primitives from the FIFO 604.

The rendering processors 605 performs the y-axis coordinate offset. The data at this point consists of bounding coordinates, slopes and offsets.

In the currently preferred embodiment the geometry engine contains eight (8) rendering processors 605. The rendering processors 605 are Application Specific Integrated Circuit (ASIC) chips. Each rendering processor is responsible for rendering 2 pixels at a time. The rendering processor 605 contains such elements as a Data Differential Analyzer (DDA), a 45 degree accelerator and pixel cache. Such elements are described in greater detail below with respect to Geometry Engine performance.

The rendering processors 605 are further coupled to static RAMs 606 (which contain the pixel maps) and a pixel bus interface 607. The pixel maps 606 each define a sampled sub-pixel map. The currently preferred method of performing pixel intensity calculations with pixel maps is described in more detail below. However, other known methods of obtaining pixel intensity values could be utilized.

The pixel bus interface 607 is for the control of sending pixel intensity values to the beam boards. The pixel values are inserted into packets and transferred to the beam boards via the pixel bus. A sub-frame is divided into 32 pixel packets of 1024 pixels each for transfer. The packet address are sent with a sub-frame. This address specifies where in the Beam Board memory to store it. This address is provided by the host computer 501 (see FIG. 5). The details of transferring pixel packets is described in more detail with respect to the pixel bus.

Also coupled to the control processor 605 is a ROM memory 603. The ROM memory 603 is used by the processor 601 for storing control instructions for initializing the processor 601. The initialization consists of loading a control program into program memory 608.

Determining Pixel Intensity Values

The rendering components 605 determine a pixel intensity value by tallying the contributions of the geometric primitives at the pixel location being rendered.

Figures 7B, 7C:
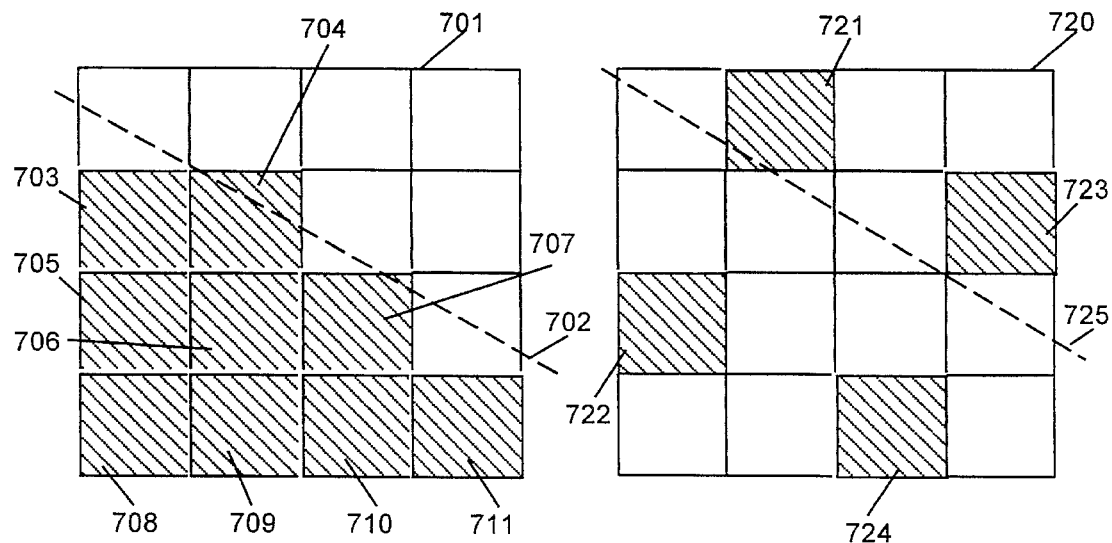
FIG. 7b is an illustration of full sub-pixel map as known in the prior art.
FIG. 7c is an illustration sampled sub-pixel map as may be utilized in the preferred embodiment of the present invention.
Figure 7A:
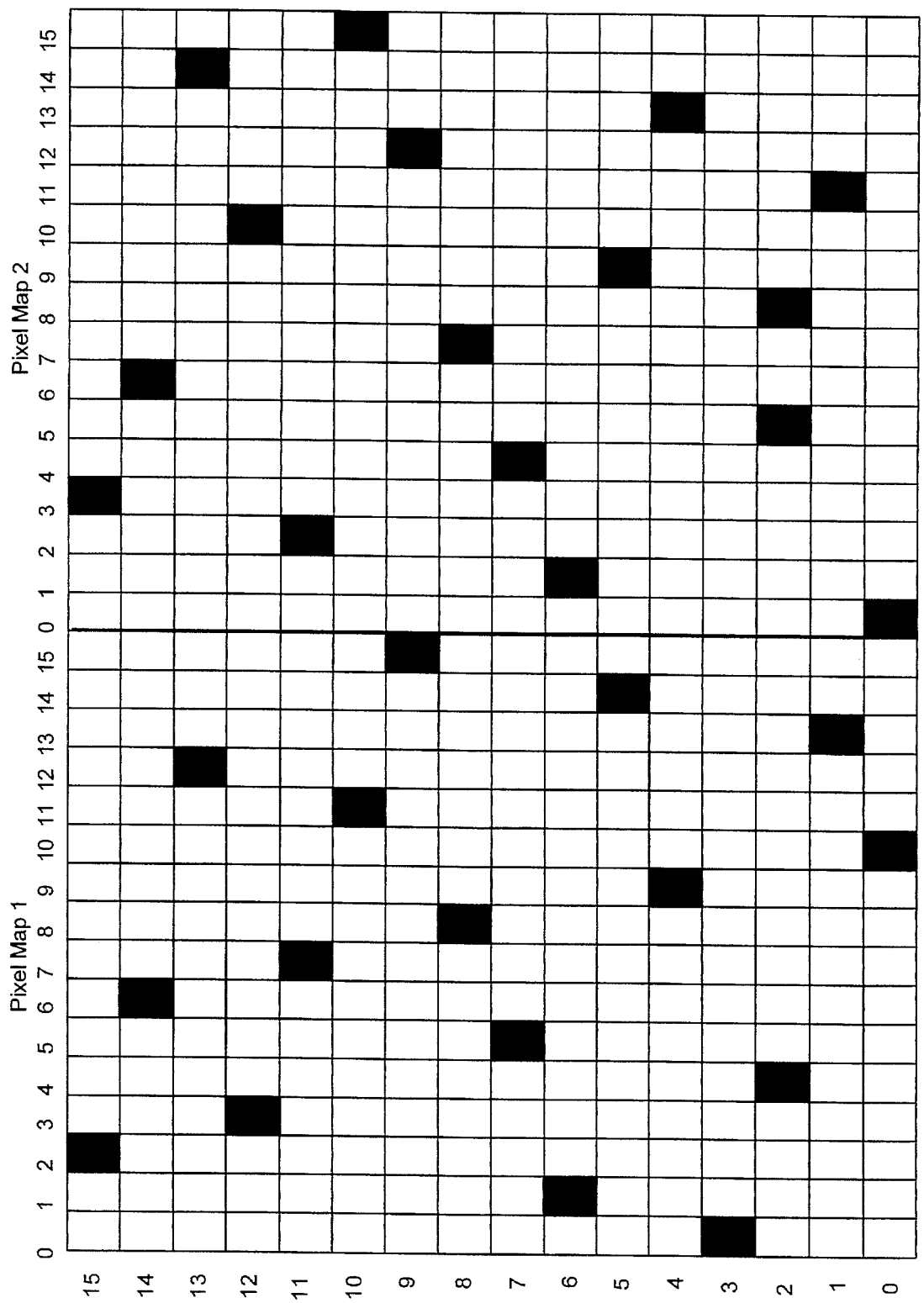
FIG. 7a illustrates two subpixel maps as may be utilized by the currently preferred embodiment of the present invention.

A sub-pixel grid allows the correct intensity to be calculated when overlapping geometries occur. A geometry is generated on the sub-pixel map using known on/off pixel type algorithms (e.g. Bresenham DDA Algorithm). A pixel is then formed from a group of sub-pixels. In the currently preferred embodiment, a sub-pixel grid consists of 32 sub-pixels on a side. For each pixel there are 1024 sub-pixels. Since there are two physical stage passes ½ the dose is deposited at a time. To minimize storage requirements the grid used and stored on each pass is 16 sub pixels on a side for a total of 256 sub-pixels. Two different grids are used; one for odd pixels and one for even pixels. Such grids are as illustrated in FIG. 7a. During the second interstitial pass the address is offset in the X and Y directions by a one sub-pixel space, to force sampling of the odd addresses. The stage is positioned such that the pixel is placed in the correct location.

In order to minimize the amount of storage required for pixels, a technique which samples the full sub-pixel approach is utilized. One requirement for a sample is that there is only one sub-pixel for each X or Y sub-pixel address. This allows correct edge placement of rectangles. So no matter how over lapped, or ordered the answer is correct and the same. Second, a good sample would have a random spread of the sampled points, so that the error in any arbitrary line would be "small". FIGS. 7b and 7c illustrate a full sub-pixel and a good sample, respectively, for the simple case of 4 sub-pixels per side.

Referring to FIG. 7b, a pixel 701 is illustrated. Assume a line 702 through the pixel 701 is used to indicate a portion of the pixel 701 below the line which should be "on". Thus, the sub pixels 703–711 would be "on". The pixel intensity value would be 9/16. This is the exact intensity value for the pixel.

Referring to FIG. 7c, a sample of the full sub-pixel approach is illustrated. A sample pixel 720 has sampled sub pixels 721–724 as it's sample points. Note that no two of the sub pixels 721–724 have the same X or Y sub pixel address. Here, a line 725 corresponds to the line 702 of FIG. 7a. However in this case only sampled sub pixels 722 and 724 would be "on". This results in an intensity value of 2/4=½. As the "exact" intensity value is 9/16 an error of 1/16 occurs.

In the case of arbitrary lines, the sampled approach trades off accuracy for reduced storage requirements. For the case of horizontal lines and vertical lines, no error occurs. Since the primary concern is placement accuracy of horizontal and vertical lines, this is an acceptable tradeoff. This tradeoff translates into lower cost and higher performance.

Techniques for determining the set of good sampled sub-pixel maps is known in the art. The problem simply stated is the identification of the combination of entries on a grid where there is one and only one entry in every row and one and only one entry in every column.

Selection of the sampled sub-pixel map to be used for a particular geometry is determined by exhaustive search. The selected pattern is slightly more optimum for 45 degree edges.

When determining the final pixel intensity value, contributions from overlapping geometry primitives must be considered. Thus, the intensity values derived from each geometry primitive are tallied to generate the final intensity value for a pixel.

Rendering Performance Of A Geometry Engine

Rectangles take two clock cycles to do an edge. If all the pixels are to be filled by all the rendering processors, then a one cycle write can be performed. Otherwise a two cycle read-modify-write cycle is done. A rectangle can be applied to a pixel map in one cycle.

Normally 45 degree angled trapezoids would be done by the DDA engine. This is slow in comparison to the rectangles, about nine times slower. Since a large number of 45 degree angled trapezoids geometries are expected in the patterns to be generated, a 45 degree accelerator has been added. The DDA is used to step by one pixel. The bottom and top edges of the trapezoid are formed as rectangles. Left and right edges (the 45 degree lines) are formed by picking the 45 degree line and illuminating all the pixels to the right (or left). Since there are 16 sub-pixels per side, there are a total of 32 different 45 degree slopes.

Note that angles close to 45 degrees can also be processed with 45 degree accelerator. Angles of 44 degrees to 46 degrees can be done. Since Fracturing Algorithms can make small errors the resulting Angle may not be exactly 45 degrees. So the DDA is run with correct angle and stepping up 1 pixel at a time, but the edges are formed with the 45 degree accelerator hardware. The resulting errors are acceptably small. Thus near 45 degree lines can be rendered as fast as a rectangle.

To reduce the time for rendering a trapezoid with non-45 degree lines, a pixel cache is implemented. The cache stores 8 pixels on the rendering processor 605. Thus a geometry engine can render up to a 17 micron wide object in one clock cycle per memory access instead of two clock cycles. The cache algorithm is one in which the first 4 used pixels on a row are kept in cache. Thus only objects wider than the cache are slowed down. Thus at least the first 17 microns of an object can be rendered at a faster rate. To best exploit the pixel cache, the processor 601 fractures any trapezoid larger than 17 microns to one that is less so that all trapezoids can be rendered as fast as possible.

Beam Boards

The beam board serves as a buffer between the geometry engines and the pattern generation apparatus. In the currently preferred embodiment, there is one beam board for each beam of the pattern generation apparatus. The board interfaces to the pixel bus and maintains a buffer to drive the print generation apparatus on demand as signaled by a print clock from the pattern generation apparatus.

The pixel data comes from the Geometry Engines in the form of packets. Each packet is 1024 pixels in length. Each pixel is a five bit gray-scale level. Associated with each pixel packet is a 17 bit address. The address identifies a page of frame buffer memory for storage of the packet.

Figure 8:
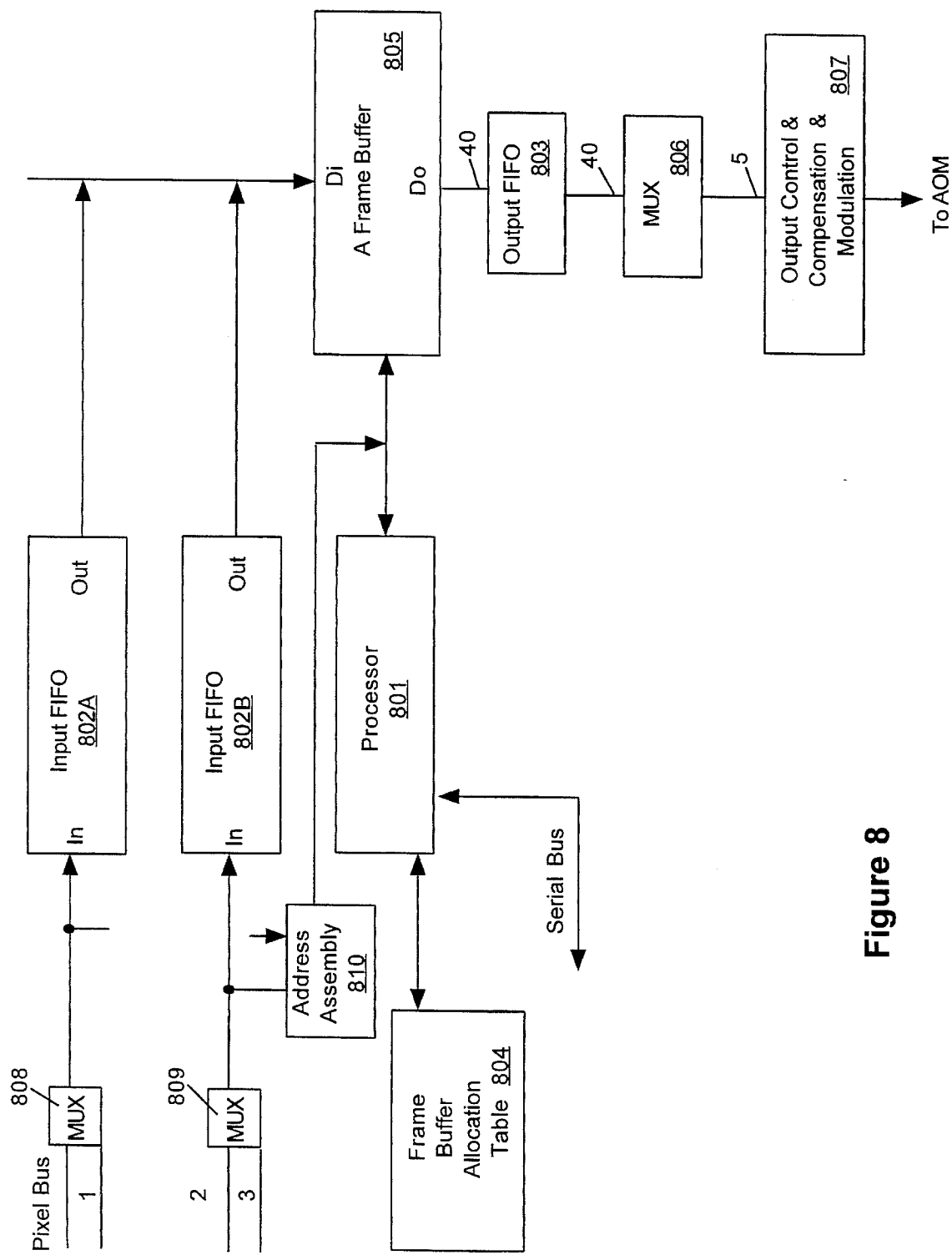
FIG. 8 is a block diagram illustration of a beam board as may be utilized in the currently preferred embodiment of the present invention.

FIG. 8 is a block diagram of a beam board as utilized in the currently preferred embodiment. Referring to FIG. 8, a control processor 801 controls the operation of the beam board. In the currently preferred embodiment a TMS320c31 processor available from Texas Instruments Corporation of Houston, Tex., is utilized. The control processor 801 communicates with the host computer and controls the movement and storage of pixel data. The control processor 801 receives pixel packet addresses for the packets from the Pixel Bus through address assembly register 810 and manages the storage of the pixel packet into frame buffer memory 805.

Pixel packets are received by the beam boards, stored in Input FIFO 802a and 802b. Each FIFO is four packets deep and eight pixels wide. Associated with each FIFO is a Frame Buffer packet destination address register. Each pixel packet has a packet address which is transferred to the packet destination address register. The packet address transferred with each packet generates an interrupt to the control processor 801 signaling the processing of a packet waiting in the input FIFO 802. The packet address is the physical address for insertion of the packets pixel data into frame buffer, 805. The data from the input FIFO 802 is directly piped to the frame buffer 805.

The frame buffer 805 is a 1, 4, or 16 meg-word block of memory for the storage of pixels where a word is 8 pixels wide. In the currently preferred embodiment, this memory is not directly addressable by the processor. The frame buffer 805 is organized into pages which are flagged, e.g. semaphored, to prevent data from being overwritten.

The transfer from the input FIFO 802 to the frame buffer 805 is controlled by the destination address register which when loaded with a Frame Buffer pixel packet destination address causes a packet to be transferred from the input FIFO 802 into the frame buffer 805. A processor interrupt is generated when the address register is empty.

The output FIFO 803 receives data packets from the frame buffer 805 and holds the data for transfer to the AOM driver of the pattern generation apparatus. The output FIFO 803 is four packets deep and eight pixels wide. Associated with the output FIFO 803 is a Frame Buffer address register which when loaded with a Frame Buffer pixel packet source address causes a packet to be transferred from the Frame Buffer 805 into the output FIFO 803. A processor interrupt is generated when the address register is empty. This register is double buffered for pipelining.

The output FIFO 803 is emptied as print clocks are received. The data is reduced from 8 pixels wide to one pixel wide through a MUX 806. The pixel is then translated from linear to non-linear values through a look up table, then timing is compensated, and translated to a voltage level. This voltage level is then used to modulate 200 MHz sine wave, the result is amplified to 1 watt. This is accomplished through an output control, compensation and modulation unit 807. This signal is then delivered to the AOM of the pattern generation apparatus.

The frame buffer allocation table 804 is a block of memory directly addressable by the control processor 801. The table 804 keeps track of the pages in the frame buffer 805 that are in-use and prevents a new pixel packet from over writing data which has not been printed. The table 804 contains two bits per pixel packet page in the frame buffer for a minimum table size of 8K words. One of the two bits is used as write protection and other is used as an in-use semaphore.

When there is data in the input FIFO 802 the destination address must be verified against the allocation table 804. First the semaphore bit is checked to see if the page is available. If the page is not available the input transfer process stops and waits for that page to empty. If the page is available the write protection bit is checked. If the page is write enabled then the address of the page is handed off to the queue for the input transfer address register. If the page is read only, an error is flagged and a message is passed back to the host computer with information regarding the fault.

The input transfer address register interrupts the processor after the register empties signaling to the processor that the hardware is ready to accept a new address. When this interrupt occurs the next address from the queue of addresses is loaded into the register. After the next address is written the previous address is marked in the table 804 as in-use.

If a pixel packet does not transfer successfully a flag is set to indicate that a bad packet is in the FIFO. The control processor 801 automatically signals the geometry engine to re-send the packet. The bad packet is then transferred into an area in the frame buffer 805 where it can then be examined to determine why transfer was unsuccessful.

Beam Board Pass List

A Beam board pass list describes the order in which the pixel data must be transferred from the frame buffer to the pattern generation apparatus. The pass list is sent from the host computer over the serial bus and stored in memory on the beam board for later execution. The basic unit for pass list information is a 32 bit value or one word. Each word in the pass list is either an instruction, instruction with data or an instruction followed by data. The pass list is processed in the control processor 801 by a software interpreter. Each data object is an interpreter instruction much like a processor executes assembly code. The interpreter includes a call/return mechanism for a hierarchical structure in the pass lists. This hierarchical structure can then be used to describe the pass information for printing an individual die at the lowest level. The higher level of the structure then calls each die in the order desired for a given pass.

The pass list consists of a starting address and the number of transfers beginning at that address. The process of traversing the pass list consists of generating an address, validating the address against the allocation table, and then handing the address off to the queue for the output transfer address register. The process of validating the address consists of checking the in-use semaphore to determine if the data is present in the frame buffer.

The transfer address register interrupts the processor when the FIFO is less than half full and the address register is empty. When the interrupt occurs the next transfer address is loaded from the queue of processed addresses. After the next address is written the previous address is marked as free.

Pixel Bus

The geometry engines are coupled to beam boards through a pixel bus. The pixel bus serves two main functions. The first function is to transfer data from the geometry engines to the beam boards at a high aggregate rate of transfer. In the currently preferred embodiment the maxim transfer rate is over 2 giga-pixels per second. The second function is to distribute pixel packets from one geometry engine to 32 different beam boards. This is because each geometry engine rasterizes a sub-frame. Portions of the sub-frame are printed using each of the plurality of laser beams in the "brush".

Figure 9:
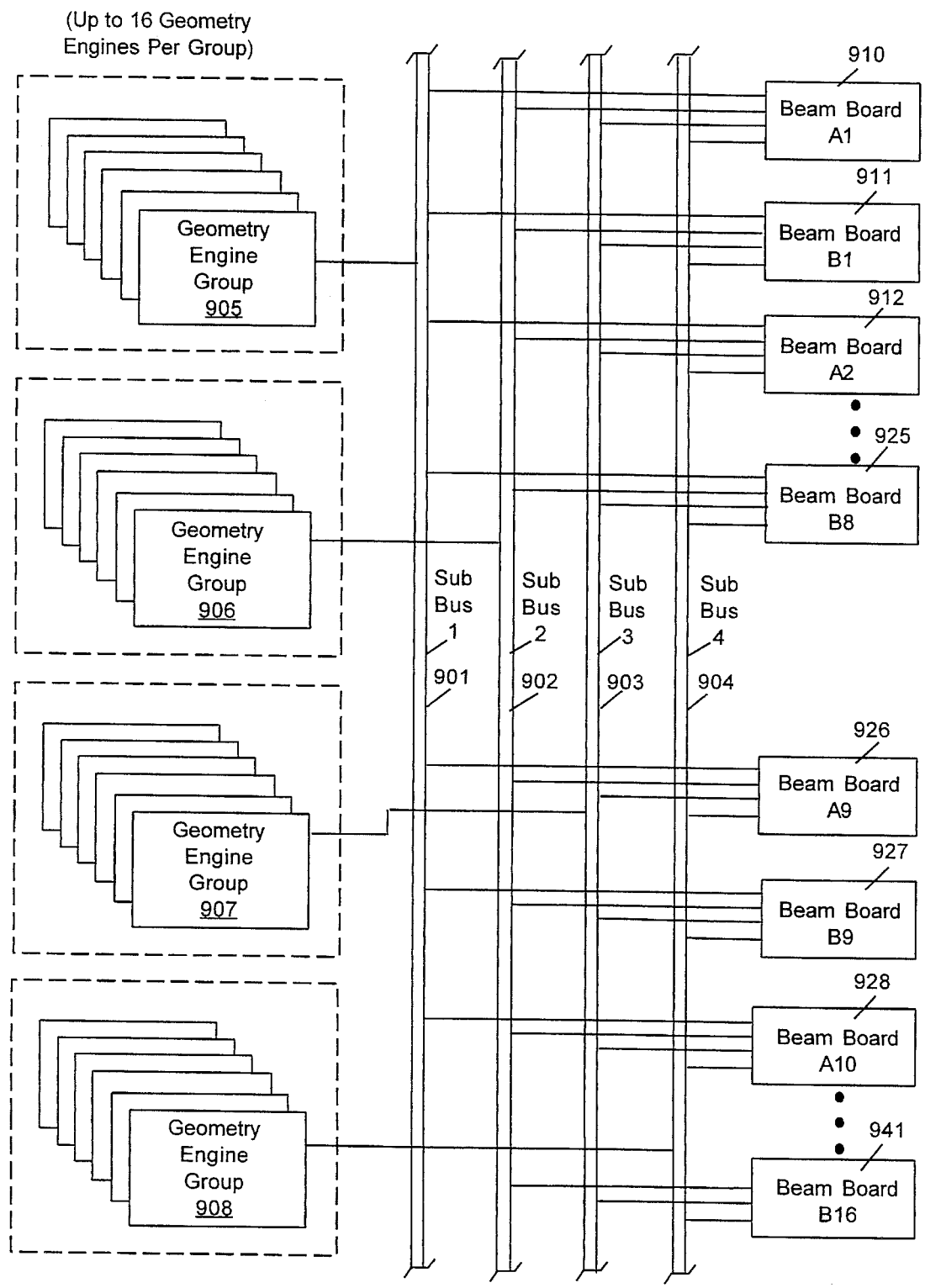
FIG. 9 is a block diagram illustration of a Pixel Bus as may be utilized in the currently preferred embodiment of the present invention.

The pixel bus of the currently preferred embodiment is illustrated in FIG. 9. Referring to FIG. 9, the pixel bus is comprised of four (4) sub-buses 901–904. The geometry engines are organized into 4 groups 905–908. Each geometry engine in a group couples to the same sub-bus. Finally, each beam board 910–941 is coupled to each of the sub-buses 901–904.

Other configurations could be utilized to satisfy the pixel bus requirements, e.g. each geometry engines coupled to each sub-bus and each beam board only coupled to one sub-bus. However, the configuration of the currently preferred embodiment utilizes the fewest number of component parts.

The geometry engines transfers pixel packets across the pixel bus. A pixel packet is 1024 pixels long by 16 pixels wide. A rasterized sub-frame would comprise 64 packets. An entire sub-frame of pixels is transmitted a packet at a time. The first group of pixels starts in the lower left corner of the sub-frame and extends for a width of 16 pixels to the top left corner of the sub-frame (packet 0). The successive grouping of pixels continues across the sub-frame in the same manner.

In the currently preferred embodiment, each sub-bus is comprised of the following lines:

1. Serial Address Lines (PADR)
2. Address Bits Valid line (PAV_N)
3. 80 pixel data lines, comprising 16 pixels with 5 bits of data per pixel (PIX(1:0)b(5:0))
4. 16 parity bits for each pixel data group (PPAR(15:0))
5. Request to Transfer Data line (PRQ_N)
6. Acknowledgment to Transfer Data line (PACK_N)
7. Pixel Data Valid line (PVAL_N)
8. Bus busy signal to transfer control between geometry engines (BBUSY_N)
9. A fault indication from Beam Boards indicating a bad transmission (PERR_N)
10. A receive now signal from the controlling beam board to the other beam boards in a group of 16 beam boards (BBRN_N)
11. A check on the input FIFOs of the beam boards that is asserted with an input FIFO is full (FULL_N)
12. GEADR is the address of the next geometry engine allowed to transmit on the bus.

The geometry engines within a group pass control of a sub-bus from the current geometry engine to the next geometry engine to transfer. The host processor determines the order in which the geometry engines transfer data to the beam boards.

Only the geometry engine which currently owns the pixel bus is allowed to drive the geometry engine address bus. The other geometry engines monitor the bus during this time.

Figure 10:
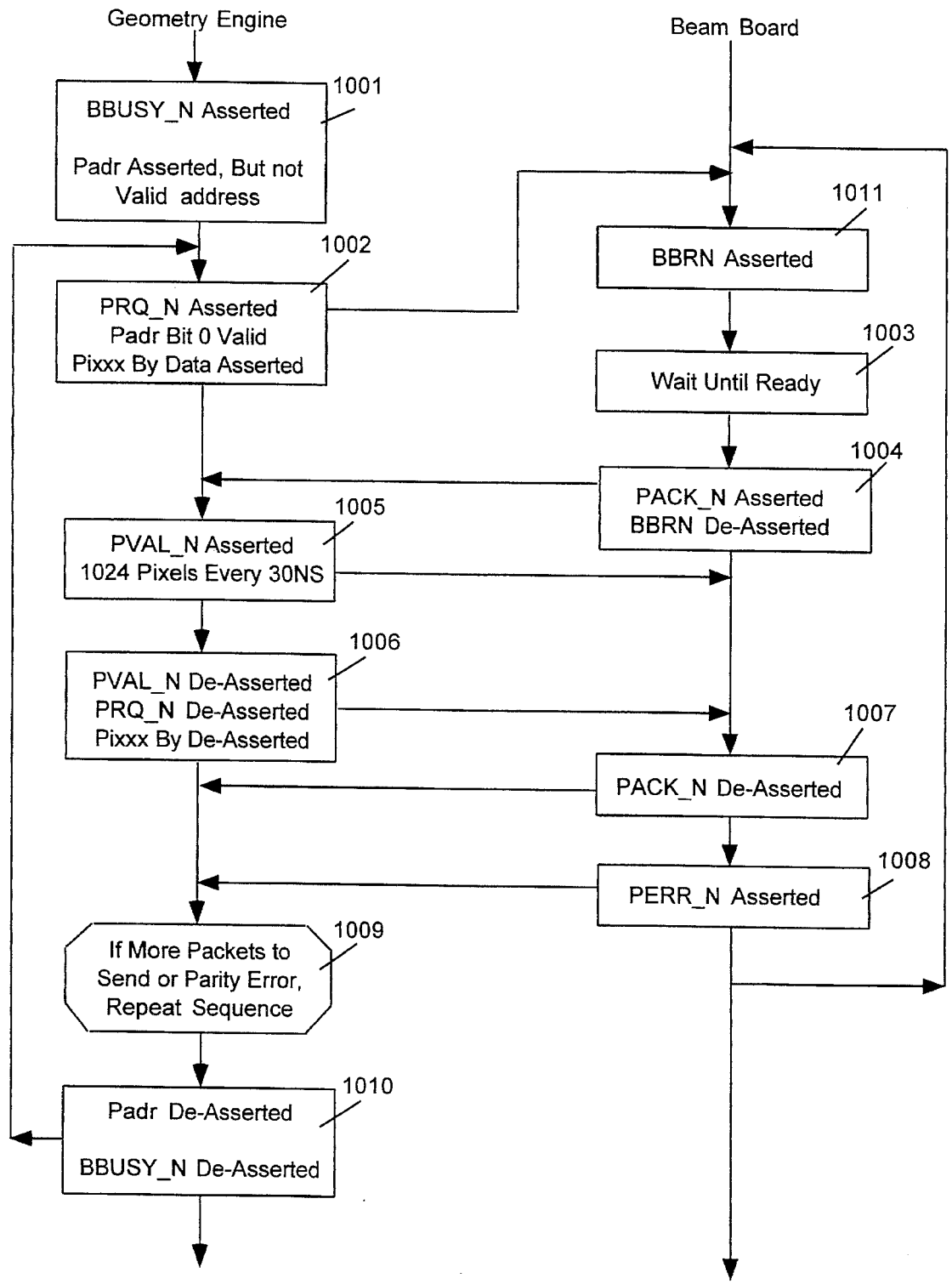
FIG. 10 is a flow diagram of the pixel bus transfer protocol as may be utilized in the currently preferred embodiment of the present invention.

The protocol for transfer of packets across the pixel bus is described with reference to FIG. 10. A geometry engine initiates transfer by asserting BBUSY_N and PADR on the bus, box 1001. This has the effect of gaining access to the bus. Next, the geometry engine asserts beam board request signal PRQ_N, sets bit 0 of PADR to a valid value and asserts the pixel packet data on the bus, box 1002.

At this point the beam board must respond. The beam board waits until it is ready to receive, box 1003. Each Beam Board asserts BBRN a wire "AND" signal. When all 16 Beam Boards of a group (A1–B8 or A9–B15) have asserted BBRN then the signal is logical 1, thus all boards are ready to receive. When ready, the beam board A1 (or A9) asserts acknowledgment signal PACK_N, box 1004 and all Beam Boards in a group de-assert BBRN.

When the geometry engine detects PACK_N and signals asserted, pixel data is asserted on PVAL_N so that 1024 pixels are transmitted every 30 nanoseconds, box 1005.

When the entire sub-frame has been transmitted, the geometry engine de-asserts, PVAL_N, PRQ_and PIXxxby, box 1006. In response, the beam board de-asserts, PACK_N, box 1007.

If the beam board detects an error in one of the received pixel packets, PERR_N is asserted, box 1008. The sequence will be repeated if either an error has been detected or more packets are to be sent, box 1009. When no more packets or no error has been detected PADR and BBUSY_N are all de-asserted, box 1010.

Serial Bus

The serial bus provides a means of communication from the host computer to the geometry engines and the beam boards. Besides geometry information, the serial bus is used to transfer set-up, diagnostic and status information. The serial bus is architected into four (4) identical sub-bus structures. The host computer maintains a separate serial coupling to each of the sub-bus structures. Each sub-bus structure operates at a transfer rate of 750 kilobytes per second (resulting in an aggregate transfer rate of 3 mega bytes per second).

In the currently preferred embodiment, the serial bus operates in a master-slave model, where the host computer is the master and the geometry engines and beam boards are the slaves. The slaves do not directly communicate with each other and they do not transmit data to the master without permission. The slaves notify the master when they have data to transmit. The master acknowledges each of the slaves for transmission by sending their address and allowing them on the bus.

The serial bus is implemented in physical, data link, transport and application layers. The physical layer is based on the TMS320C30 serial channel where the master slave relationship described above is implemented.

The data link layer of the serial bus implementation provides the means of transferring data to and from the geometry engines and beam boards with guaranteed message delivery and data accuracy. The data link layer is responsible for the control of the physical serial hardware and understands the means for addressing an individual slave, the transferring of information, and checking the data for errors. At this level the data portion of a transfer is divided into packets requiring only the creation of the packet header and error checking information.

The transport layer ties the application layer and the data link layer. This layer is responsible for the assembly and disassembly of the data as it passes from master to slave and slave to master.

The application layer relates to the means which utilize the serial bus, rather than any implementation of the serial bus itself. Such means were described with respect to the host computer, geometry engines and beam boards.

Thus, a method and apparatus for generating pixel values from a file containing geometric primitives, is described.

We claim:

1. A rasterizer for generating energy beam modulation control signals for causing a plurality of energy beams coupled to the rasterizer to paint a pattern constituted with a plurality of geometry primitives, the rasterizer comprising:

(a) a processor for transforming and fracturing geometry data describing the: geometry primitives into a plurality of sub-frames of pixels, at least one geometry primitive at a time, for forming frames of pixels, which in turn are for forming stripes of pixels for forming the pattern, each frame is formed by a plurality of scan lines of pixels spanning the sub-frames of the frame in a pre-determined manner;

(b) a plurality of geometry engines coupled to the processor for concurrently receiving the fractured geometry data corresponding to the sub-frames of at least one frame, and in response, concurrently generating pixel values for these sub-frames, at least one scan line at a time; and (c) a plurality of beam modules coupled to the geometry engines and the energy beams for concurrently receiving the pixel values of the sub-frames of the at least one frame, and in response, concurrently generating the modulation control signals for controlling modulation of the energy beams to paint the scan lines of a frame, one scan line at a time.

2. In a rasterizer, a method for generating energy beam modulation control signals for causing a plurality of energy beams coupled to the rasterizer to paint a pattern constituted with a plurality of geometry primitives, the method comprising the steps of:

(a) transforming and fracturing by a processor geometry data describing the geometry primitives into a plurality of sub-frames of pixels, at least one geometry primitive at a time, for forming flames of pixels, which in turn are for forming stripes of pixels for forming the pattern, each frame is formed by a plurality of scan lines of pixels spanning the sub-frames of the frame in a pre-determined manner;

(b) concurrently receiving by a plurality of geometry engines the fractured geometry data corresponding to the sub-frames of at least one frame, and in response, concurrently generating by the geometry engines pixel values for these sub-frames, at least one scan line at a time; and (c) concurrently receiving by a plurality of beam modules the pixel values of the sub-frames of the at least one frame, and in response, concurrently generating by the beam modules the modulation control signals for controlling modulation of the energy beams to paint the scan lines of a frame, one scan line at a time.

3. The rasterizer as recited in claim 1, wherein each of said plurality of geometry engines is comprised of:

a) a first control circuit for receiving the transformed and fractured geometry data corresponding to a sub-frame and determining the received geometry data's validity;

b) a first storage circuit, coupled to said first control circuit, for storing the received geometry data;

c) a rasterizing circuit, coupled to said first storage circuit, for rendering the received geometry data into a plurality of pixel values for the sub-frame; and d) a routing circuit, coupled to said rasterizing circuit, for routing pixel values of the sub-frame to said plurality of beam modules, in quantities of at least one scan line contribution at a time.

4. The rasterizer as recited in claim 3 wherein said rasterizing circuit is comprised of a plurality of rendering processors, each of said rendering processors for rendering a predetermined number of pixels, using a sub-pixel sampling method.

5. The rasterizer as recited in claim 4 wherein each of said rendering processors is comprised of:

a) a Digital Differential Analyzer;

b) a pixel cache; and c) a forty-five degree trapezoid accelerator.

6. The rasterizer as recited in claim 5 wherein said forty-five degree trapezoid accelerator will render trapezoids that include angles that are approximately forty-five degrees.

7. The rasterizer as recited in claim 6 wherein said forty-five degree trapezoid accelerator will render trapezoids in a range from forty-four to forty-six degrees.

8. The rasterizer as recited in claim 1 wherein said processor is coupled to said plurality of geometry engines via a serial bus.

9. The rasterizer as recited in claim 8 wherein said serial bus is further comprised of a plurality of sub-buses, each of said sub-buses for coupling one or more of said plurality of geometry engines and one or more of said plurality of beam modules with said processor.

10. The rasterizer as recited in claim 1 wherein said plurality of geometry engines are coupled to said beam modules via a bus circuit, said bus circuit is comprised of a plurality of sub-buses, each of said sub-buses for coupling a predetermined group of said geometry engines with each of said beam modules.

11. The rasterizer as recited in claim 4, wherein for each pixel, each rendering processor divides the pixel into a plurality of sub-pixels with a sub-pixel grid, maps a line onto the sub-pixel grid, samples N of the sub-pixels, determines the number of sub-pixels having a predetermined relationship to the line (X), and generates the pixel value based on the ratio of X/N.

12. The rasterizer as recited in claim 2 wherein step a) comprises rendering the received geometry data into pixel values by a plurality of rendering processor, each rendering processor rendering a predetermined number of pixels, using a sub-pixel sampling method.

13. The method as recited in claim 12, wherein step (b) comprises, for each pixel, dividing the pixel into a plurality of sub-pixels with a sub-pixel grid, mapping a line onto the sub-pixel grid, samples N of the sub-pixels, determining the number of sub-pixels having a predetermined relationship to the line (X), and generating the pixel value based on the ratio of X/N, by the rendering processor.

* * * * *